(12) United States Patent  
Okamura

(10) Patent No.: US 8,709,159 B2  
(45) Date of Patent: Apr. 29, 2014

(54) VERTICAL HEAT TREATMENT APPARATUS

(75) Inventor: Nobuyuki Okamura, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 1207 days.

(21) Appl. No.: 12/170,477

(22) Filed: Jul. 10, 2008

(65) Prior Publication Data

US 2009/0044746 A1    Feb. 19, 2009

(30) Foreign Application Priority Data

Aug. 16, 2007    (JP) .................. 2007-212076

(51) Int. Cl.  
    *C23C 16/00*    (2006.01)  
    *C23F 1/00*    (2006.01)  
    *H01L 21/306*    (2006.01)

(52) U.S. Cl.  
    USPC ........... 118/725; 118/715; 118/724; 118/733; 156/345.27

(58) Field of Classification Search  
    CPC .............. C23C 16/4412; C23C 16/455; C23C 16/45561; C23C 16/482; C23C 16/45502; C30B 25/14; H01L 21/67109; H01L 21/67303; H01L 21/67248; H01L 21/67115  
    USPC ............ 118/715, 724, 725, 733; 219/121.21, 219/121.22, 390; 156/345.27  
    See application file for complete search history.

(56) References Cited

U.S. PATENT DOCUMENTS

| | | | | |
|---|---|---|---|---|
| 5,520,742 | A | * | 5/1996 | Ohkase .................. 118/724 |
| 5,622,639 | A | * | 4/1997 | Kitayama et al. ............. 219/390 |
| 2002/0023588 | A1 | * | 2/2002 | Yamamuka et al. .......... 118/715 |
| 2007/0095283 | A1 | * | 5/2007 | Galewski ....................... 118/715 |
| 2008/0044785 | A1 | * | 2/2008 | Anbai et al. ................... 432/241 |

FOREIGN PATENT DOCUMENTS

| | | |
|---|---|---|
| JP | 06-44140 | 6/1994 |
| JP | 3116905 | 10/2000 |
| JP | 3378241 | 12/2002 |

OTHER PUBLICATIONS

English Translation JP 11-329990, Tsutomu et al dated Nov. 30, 1999.*

* cited by examiner

*Primary Examiner* — Rakesh Dhingra  
(74) *Attorney, Agent, or Firm* — Dickstein Shapiro LLP

(57) ABSTRACT

A vertical heat treatment apparatus enabling the insertion of a temperature sensor in the reaction tube without disassembling the apparatus is disclosed. The vertical heat treatment apparatus includes a reaction tube; a heating section; a wafer holding section; a supporting section movably provided in the vertical direction so as to seal the reaction tube while the wafer holding section is in the reaction tube; a temperature sensor insertion section provided in the supporting section and having a through hole for guiding a temperature sensor so that the temperature sensor can be inserted into the reaction tube; and a cap section for opening and closing the through hole of the temperature sensor insertion section while the wafer holding section is on the supporting section.

3 Claims, 8 Drawing Sheets

VERTICAL HEAT TREATMENT APPARATUS

CROSS-REFERENCE TO RELATED APPLICATIONS

The present application claims priority under 35 U.S.C §119 to Japanese Patent Application Publication No. 2007-212076 filed Aug. 16, 2007, the entire contents of which are hereby incorporated herein by reference.

BACKGROUND OF THE INVENTION

1. Field of the Invention

The present invention generally relates to a heat treatment apparatus for heating a substrate such as a semiconductor wafer (hereinafter referred to as "a wafer"), and more specifically to a vertical heat treatment apparatus including a reaction tube, a heating section disposed around the reaction tube, a wafer holding section for holding a wafer in the reaction tube, and a supporting section movably provided in the vertical direction so that the wafer holding section can be put into and taken off from the reaction tube and provided so as to seal the reaction tube while the wafer holding section is disposed inside the reaction tube.

2. Description of the Related Art

As an example of a heat treatment apparatus for heating wafers, there has been known a vertical heat treatment apparatus capable of processing plural wafers as a batch process (see, for example, Japanese Patent Nos. 3116905 and 3378241).

FIG. 9 schematically shows a conventional vertical heat treatment apparatus.

The vertical heat treatment apparatus includes a reaction tube 21 for heating the wafer in the reaction tube 21. A heater 23 is provided around the reaction tube 21 for heating the reaction tube 21. A circular quartz flange 25 having substantially the same inner diameter as that of the reaction tube 21 is provided at the opening section of the reaction tube 21.

An SIC (Silicon carbide) boat 27 is provided to hold the wafers in the reaction tube 21. The SIC boat 27 is on a sealing cap 29 that is movably provided in the vertical direction, in a manner so that a base quartz section 31, a fin heat retaining tube 33, and an SIC heat retaining tube 35 are placed between the SIC boat 27 and the sealing cap 29.

The base quartz section 31 having a disk shape is on the sealing cap 29. The fin heat retaining tube 33 including quartz and having fins is on the base quartz section 31. The SIC heat retaining tube 35 is on the fin heat retaining tube 33, and the SIC boat 27 is on the SIC heat retaining tube 35.

When the sealing cap 29 is lifted up, the SIC boat 27 is in the reaction tube 21. Then, the upper surface of the sealing cap 29 is in contact with the quartz flange 25 to seal the reaction tube 21.

For example, when a vertical heat treatment apparatus for heating wafers for diffusing impurities has no temperature sensor to monitor a temperature, a temperature sensor using, for example, a thermocouple is required to be inserted in the reaction tube 21 to periodically measure a temperature profile or check the temperature in the reaction tube 21.

To that end, an insertion hole 29a for inserting a temperature sensor in the reaction tube 21 is previously provided in the sealing cap 29. On the other hand, there is no such insertion hole on the base quartz section 31 on the sealing cap 29 in view of the fact that chlorine gas may be used in the baking process. Due to this situation, to insert a temperature sensor into the reaction tube 21 as shown in FIG. 10, it is necessary to replace the base quartz section 31 with another base quartz section 37 on which a temperature sensor insertion section 37a is formed. Since the fin heat retaining tube 33, SIC heat retaining tube 35, and SIC boat 27 are placed on the base quartz section 31 to be replaced, it is also necessary to disassemble those parts when the base quartz section 31 is required to be replaced.

In addition, when the fin heat retaining tube 33, the SIC heat retaining tube 35, and the SIC boat 27 that have been disassembled are reassembled in their original positions, a position error due to the disassembling process may occur. Due to the caused position error, it becomes necessary to make adjustments of the mounting position of the SIC boat 27 and a transfer robot. The positions of the SIC boat 27 and the transfer robot should be adjusted before the SIC boat 27 is repositioned in the vertical heat treatment apparatus so as to avoid a situation where the SIC boat is in contact with a wafer while the wafer is being transferred.

In the adjustment operations, it is necessary to adjust in the front-to-back, side-to-side, and up-to-down directions of the transfer robot, and an offset adjustment of the transfer robot itself may also be necessary when the adjustment in the up-to-down direction is carried out. The time necessary for those adjustment operations varies depending on an operator's skill, but about one through three hours may typically be required. Further, when the base quartz section 31 is replaced by the base quartz section 37, not only an operation for replacing the base quartz section 31 by the base quartz section 37 but also the operations for detaching and attaching the fin heat retaining tube 33, the SIC heat retaining tube 35, and the SIC boat 27 are required. At least 30 minutes are typically required for those detaching and attaching operations.

Furthermore, during all the above operations of replacing the base quartz section 31 by the base quartz section 37 and detaching and attaching the fin heat retaining tube 33, the SIC heat retaining tube 35, and the SIC boat 27, an operator's hands are directly used. Because of this feature, there arises a concern about polluting the reaction tube 21 with "Na" and the like. Therefore, a baking process using chlorine gas is typically performed to eliminate the pollutant after the above operations.

As described above, there are disadvantages due to the disassembling operations necessary for inserting a temperature sensor into the reaction tube in a conventional vertical heat treatment apparatus.

SUMMARY OF THE INVENTION

The present invention is made in light of the above problems, and may provide a vertical heat treatment apparatus capable of inserting a temperature sensor in the reaction tube without disassembling the vertical heat treatment apparatus.

According to an aspect of the present invention, there is provided a vertical heat treatment apparatus including a reaction tube; a heating section disposed around the reaction tube; a wafer holding section for holding wafers in the reaction tube; a supporting section movably provided in the vertical direction so that the wafer holding section can be transferred to and from the inside of the reaction tube and provided for sealing the reaction tube while the wafer holding section is in the reaction tube; a temperature sensor insertion section provided in the supporting section and having a through hole for guiding a temperature sensor into the reaction tube while the reaction tube is being sealed by the supporting section, the temperature sensor insertion section being located at the position where the temperature sensor can be inserted in the reaction tube while the wafer holding section is on the supporting section; and a cap section for opening and closing the through hole of the temperature sensor insertion section while the wafer holding section is on the supporting section.

According to another aspect of the present invention, the supporting section may include a supporting section base and a base quartz section disposed on the supporting section base. The wafer holding section may be disposed on the base quartz section in a manner so that a fin heat retaining tube having fins made of quartz is between the wafer holding section and the base quartz section. The cap section is capable of being rotated in a plane that is provided between the base quartz section made of quartz and the fin heat retaining tube and that is substantially parallel to a top surface of the base quartz section. As a result, the through hole of the temperature sensor insertion section is opened and closed by rotating the cap section.

Further, the fin heat retaining tube may include plural supporting legs and stands on the base quartz section with the supporting legs. Plural concave portions may be formed on the top surface of the base quartz section for determining the positions of the supporting legs of the fin heat retaining tube. The cap section may have arc-shaped elongated holes at the positions corresponding to the positions of the supporting legs of the fin heat retaining tube. As a result, the cap section can rotate without changing the positions of the fin heat retaining tube and the wafer holding section with respect to the base quartz section.

Further, the cap section may include fins.

A vertical heat treatment apparatus according to an embodiment of the present invention includes the supporting section movably provided in the vertical direction so that the wafer holding section can be transferred to and from the inside of the reaction tube and provided for sealing the reaction tube while the wafer holding section is displaced in the reaction tube. Further, the supporting section includes a temperature sensor insertion section having a through hole for guiding a temperature sensor in the reaction tube while the wafer holding section is in the reaction tube. The temperature sensor insertion section is disposed in a manner so that the temperature sensor can be inserted in the reaction tube while the wafer holding section is in the reaction tube. Further, there is provided a cap section provided on the supporting section and capable of opening and closing the through hole of the temperature sensor insertion section of the supporting section so as to unseal and seal the reaction tube, respectively, while the wafer holding section is on the supporting section. Because of this configuration, it becomes possible to insert a temperature sensor in the reaction tube without disassembling the apparatus by opening the through hole of the temperature sensor insertion section of the cap section. Further, by closing the through hole of the temperature sensor insertion section with the cap section, it becomes possible to prevent the gas leakage from the inside of the reaction tube to the outside of the apparatus through the through hole of the temperature sensor insertion section while the wafers are heated.

In a vertical heat treatment apparatus according to an embodiment of the present invention, the supporting section includes the supporting section base and the base quartz section on the supporting section base. The wafer holding section is on the base quartz section in a manner so that the fin heat retaining tube having fins made of quartz is between the wafer holding section and the base quartz section. The cap section is capable of being rotated in a plane that is provided between the base quartz section made of quartz and the fin heat retaining tube and that is substantially parallel to a top surface of the base quartz section. Therefore, since it is possible to open and close the through hole of the temperature sensor insertion section by rotating the cap section, it becomes possible to easily open and close the insertion hole for a temperature sensor.

Further, the fin heat retaining tube is disposed on the base quartz section with plural supporting legs of the fin heat retaining tube. Plural concave portions are formed on the top surface of the base quartz section for determining the positions of the supporting legs of the fin heat retaining tube. The cap section has arc-shaped elongated holes at the positions corresponding to the positions of the supporting legs of the fin heat retaining tube. As a result, the cap section can rotate without changing the positions of the fin heat retaining tube and the wafer holding section with respect to the base quartz section. Therefore, it is possible to open and close the through holes of the temperature sensor insertion section without changing the positions of the fin heat retaining tube and the wafer holding section with respect to the base quartz section. Further, the supporting legs extend through the elongated holes, and the position of the cap section can be determined with reference to the positions of the supporting legs of the fin heat retaining tube.

Further, when the cap section disposed on the base quartz section may have fins, the heat-retaining effect due to the cap section in addition to the fin heat retaining tube in the reaction tube may be also obtained.

BRIEF DESCRIPTION OF THE DRAWINGS

Other objects, features, and advantages of the present invention will become more apparent from the following description when read in conjunction with the accompanying drawings, in which:

FIG. 6A shows where a through hole of a temperature sensor insertion section is closed, and FIG. 6B shows where the through hole of the temperature sensor insertion section is open;

DETAILED DESCRIPTION OF THE PREFERRED EMBODIMENTS

A vertical heat treatment apparatus according to an embodiment of the present invention is described with reference to the accompanying drawings.

Figure 1:
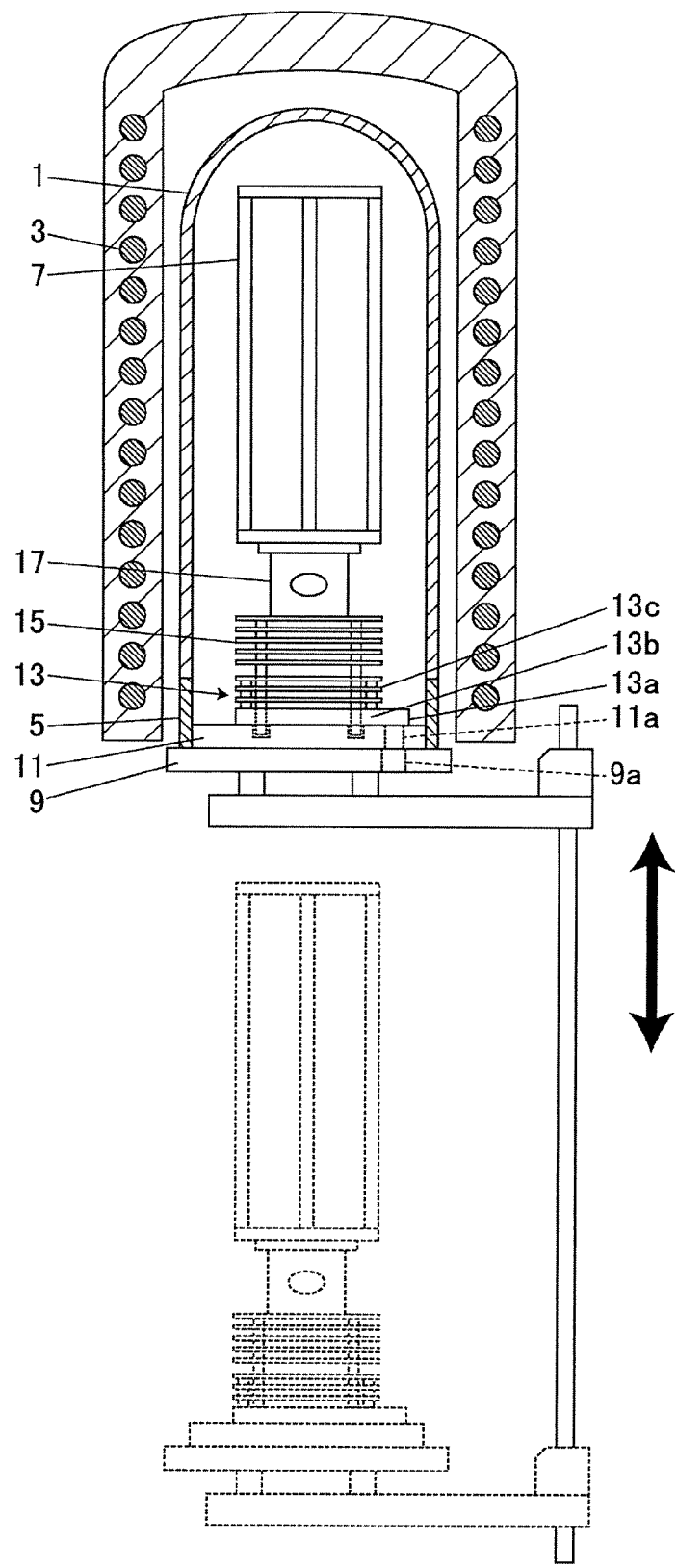
FIG. 1 is a schematic view showing the whole configuration of a vertical heat treatment apparatus according to an embodiment of the present invention.
Figure 2:
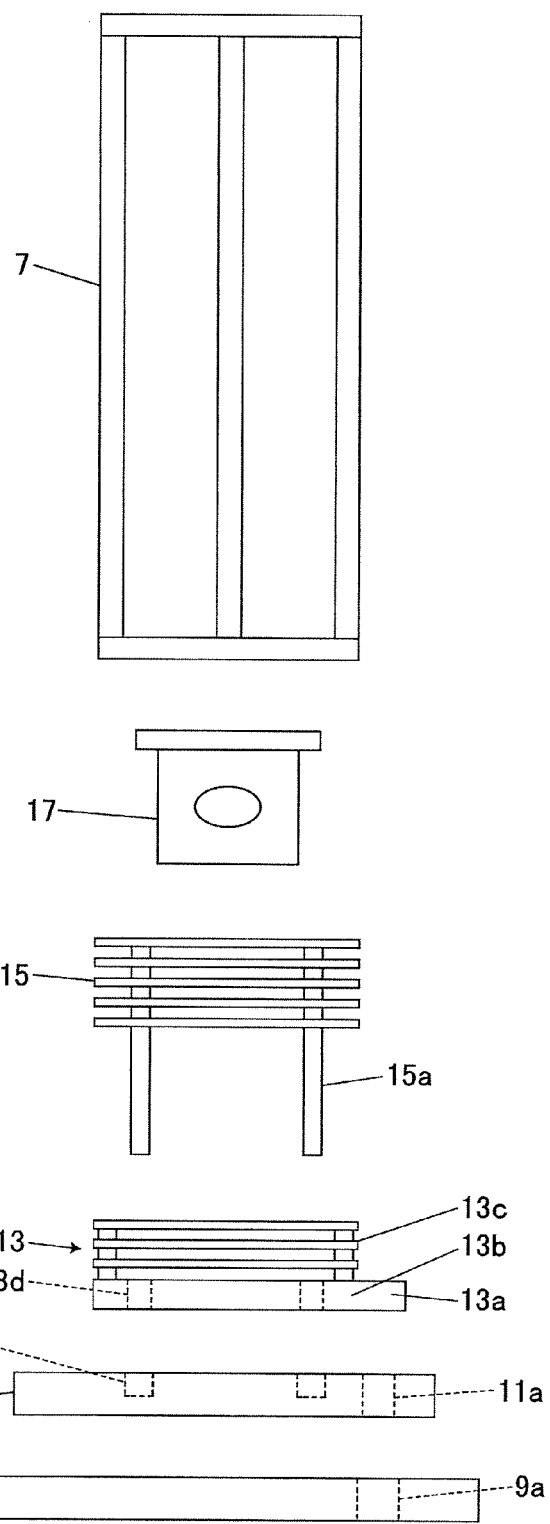
FIG. 2 is a side exploded view showing a supporting section, a cap section, a fin heat retaining section, an SIC heat retaining section, and an SIC boat in the vertical heat treatment apparatus according to an embodiment of the present invention.

As shown in FIGS. 1 and 2, the vertical heat treatment apparatus includes a reaction tube 1 made of, for example, SIC. Wafers (not shown) are positioned in the reaction tube 1 so that the reaction tube 1 heats the wafers. A heater (heating section) 3 is provided around the reaction tube 1 to heat the reaction tube 1. A circular quartz flange 5 having substantially the same inner diameter as that of the reaction tube 1 is provided at the opening section of the reaction tube 1.

An SIC boat (wafer holding section) 7 for holding the wafers positioned in the reaction tube 1 is provided on a sealing cap 9 in a manner so that a base quartz section 11, a cap section 13, a fin heat retaining tube 15 and an SIC heat retaining tube 17 are arranged between the SIC boat 7 and the sealing cap 9. The sealing cap 9 is movably provided in the vertical direction of the vertical heat treatment apparatus. The sealing cap 9 and the base quartz section 11 constitute a supporting section of the vertical heat treatment apparatus according to an embodiment of the present invention.

Figure 3:
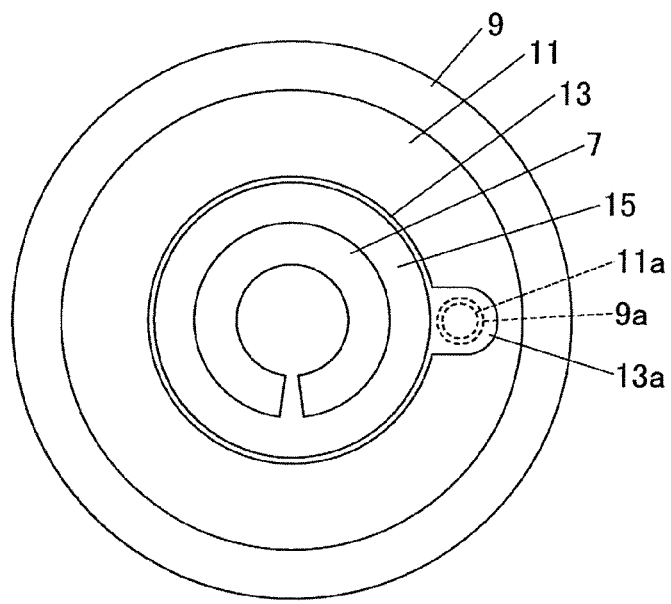
FIG. 3 is a plan view showing where the SCI boat is disposed on a supporting section base according to an embodiment of the present invention.
Figure 4:
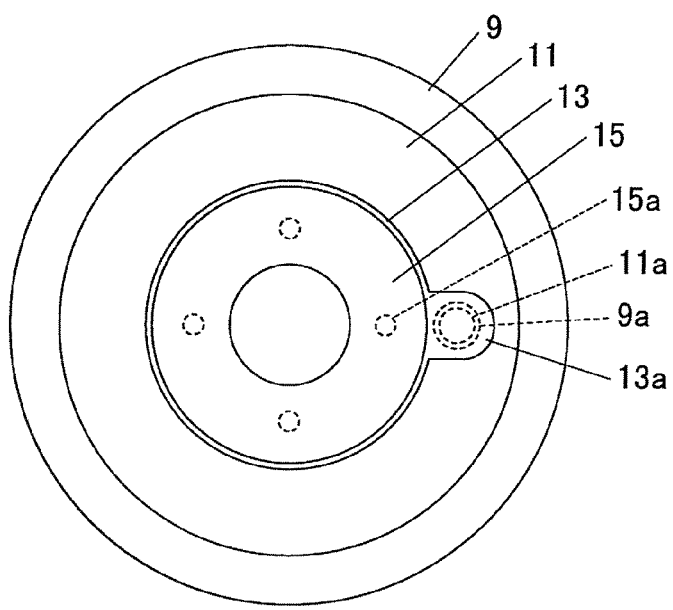
FIG. 4 is a plan view showing where the fin heat retaining tube is disposed on the supporting section base according to an embodiment of the present invention.
Figure 7:
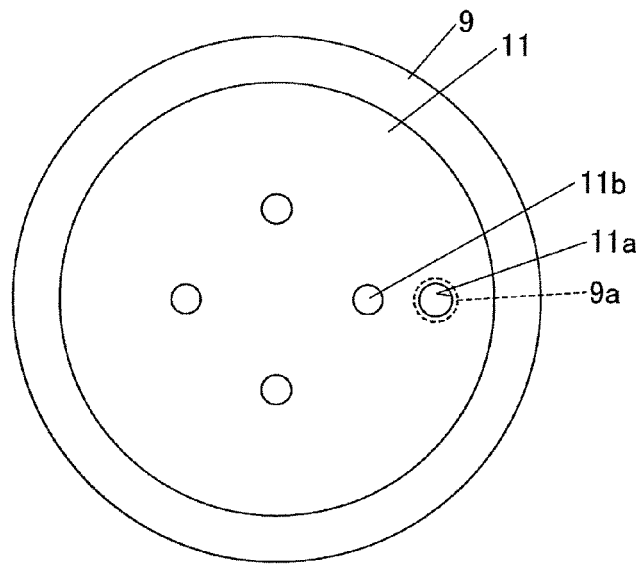
FIG. 7 is a plan view showing a base quartz section disposed on the supporting section base according to an embodiment of the present invention.

As illustrated in FIGS. 3, 4 and 7, the sealing cap 9 is made of, for example, SUS and includes a temperature sensor insertion section 9a having a through hole for guiding a temperature sensor into the reaction tube 1 while the reaction tube 1 is sealed by the sealing cap 9 and the base quartz section 11.

The base quartz section 11 having a circular shape is disposed on the sealing cap 9. The base quartz section 11 is fitted at a prescribed position of the sealing cap 9 by using a position-determining mechanism including, for example, convex portions on the bottom surface of the base quartz section 11 and concave portions on the top surface of the sealing cap 9. The base quartz section 11 includes a temperature sensor insertion section 11a having a through hole at the position corresponding to the position of the temperature sensor insertion section 9a of the sealing cap 9. Further, concave portions 11b are formed in the top surface of the base quartz section 11 so as to determine the positions of supporting legs 15a of the fin heat retaining tube 15 described below.

The temperature sensor insertion sections 9a and 11a are positioned so that a temperature sensor can be inserted in the reaction tube 1 when the SIC boat 7 is on the base quartz section 11.

Figure 5:
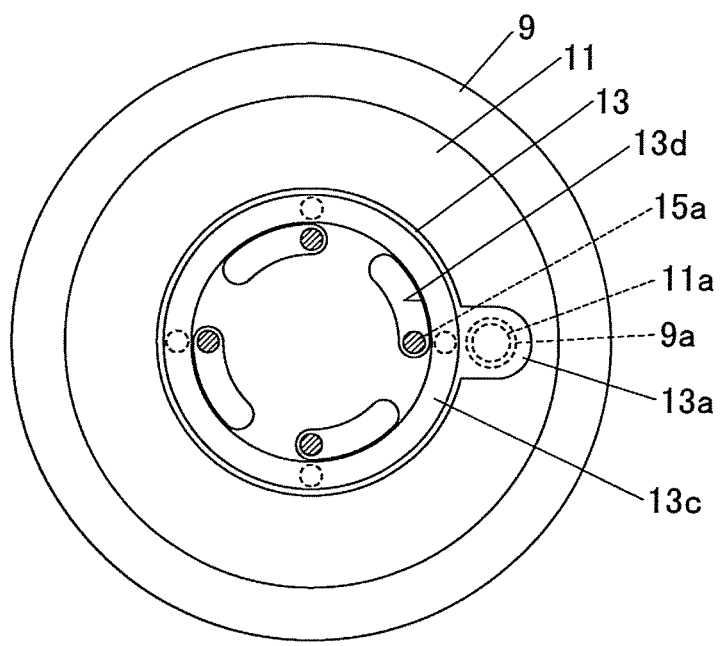
FIG. 5 is a plan view showing where the cap section is disposed on the supporting section base according to an embodiment of the present invention.
Figure 6A:
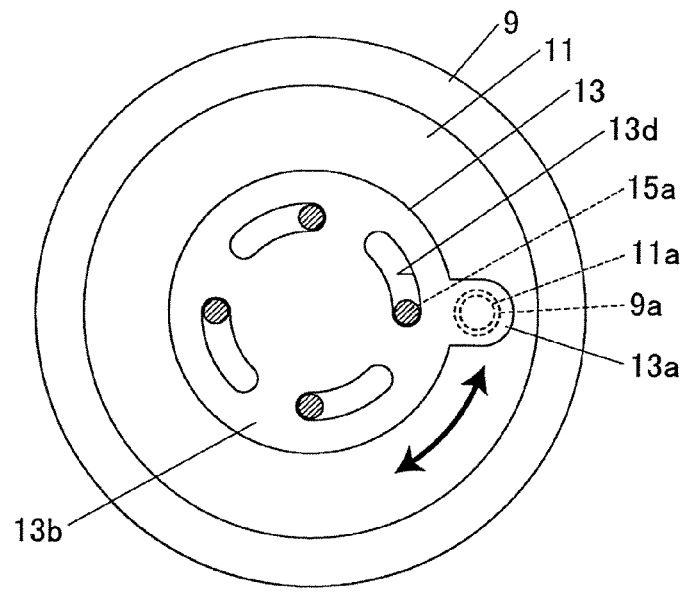
FIGS. 6A and 6B are views showing where the cap section excluding its fins and supporting legs is disposed on the supporting section base according to an embodiment of the present invention.
Figure 6B:
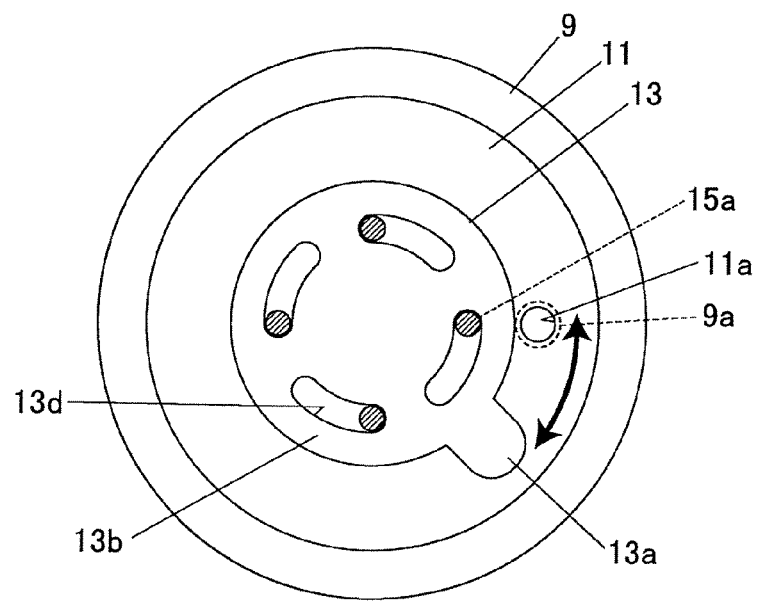

The cap section 13 made of quartz is placed resting on the base quartz section 11. The cap section 13 contacts the top surface of the base quartz section 11 and includes a protruding section 13a for opening and closing the through holes of the temperature sensor insertion sections 9a and 11a, a cap section base 13b having substantially a circular shape and including the protruding section 13a, and a fin section 13c resting on the cap section base 13b. The cap section base 13b includes elongated holes 13d having arc shapes and aligned to the positions of the corresponding supporting legs 15a of the fin heat retaining tube 15. In FIGS. 5, 6A, and 6B, the cross sections of the supporting legs 15a are shown.

The fin heat retaining tube 15 made of, for example, quartz is located above the cap section 13. The fin heat retaining tube 15 stands on the base quartz section 11 by using, for example, four supporting legs 15a. The supporting legs 15a pass through the corresponding elongated holes 13d of the cap section base 13b and fit in the corresponding concave portions 11b of the base quartz section 11.

The SIC heat retaining tube 17 is placed on the fin heat retaining tube 15, and the SIC boat 7 is placed on the SIC heat retaining tube 17.

In such a vertical heat treatment apparatus, while the wafers mounted on the SIC boat 7 are heated, the protruding section 13a of the cap section base 13b is positioned to close the through holes of the temperature sensor insertion sections 9a and 11a (see FIGS. 1 and 6A). By doing this, it becomes possible to prevent the gas leakage from inside the reaction tube 1 to the outside of the apparatus through the through holes of the temperature sensor insertion sections 9a and 11a while the wafers are heated.

Figure 8:
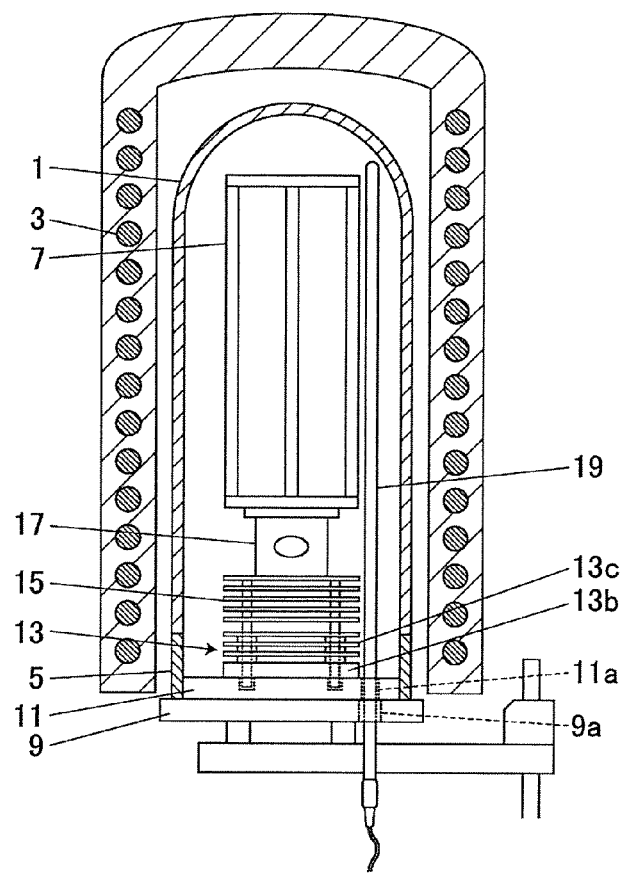
FIG. 8 is a schematic view showing the whole configuration of the vertical heat treatment apparatus according to an embodiment of the present invention when a temperature sensor is disposed in a reaction tube.
Figure 9:
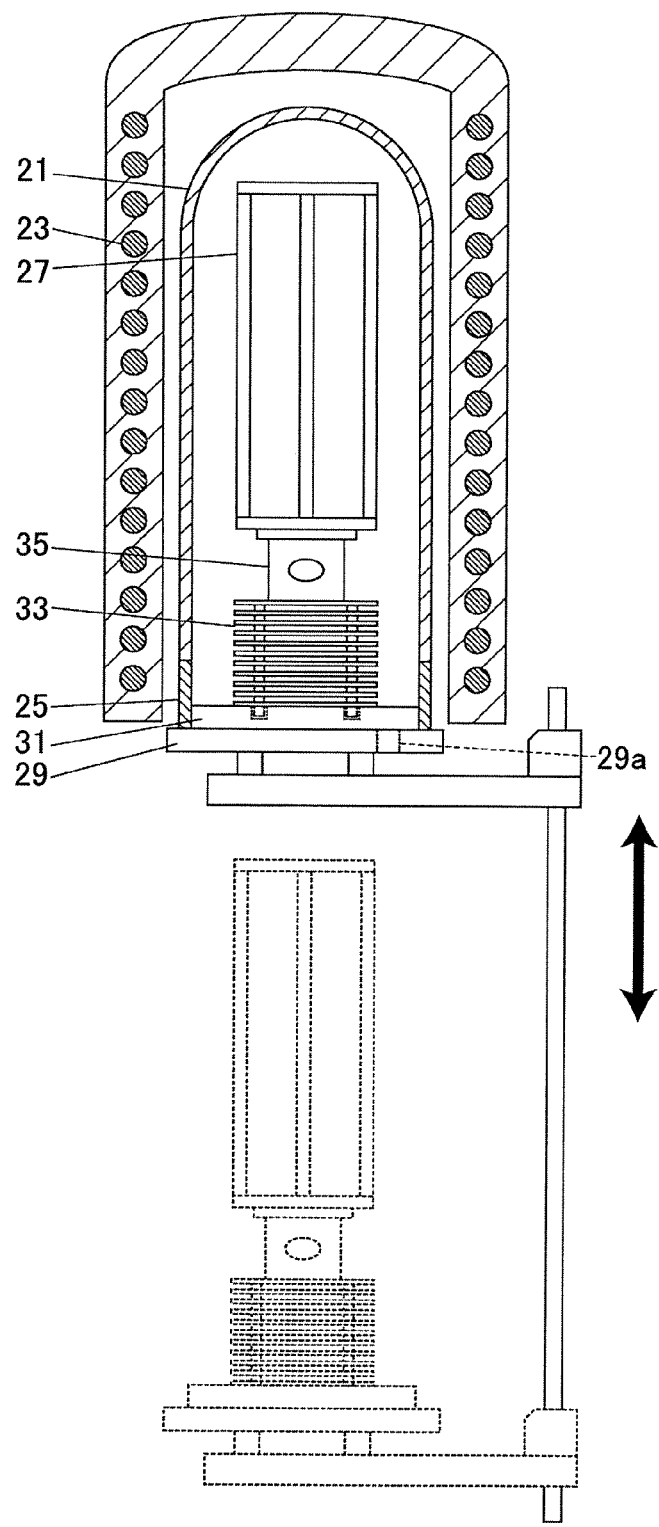
FIG. 9 is a schematic view showing a conventional vertical heat treatment apparatus.
Figure 10:
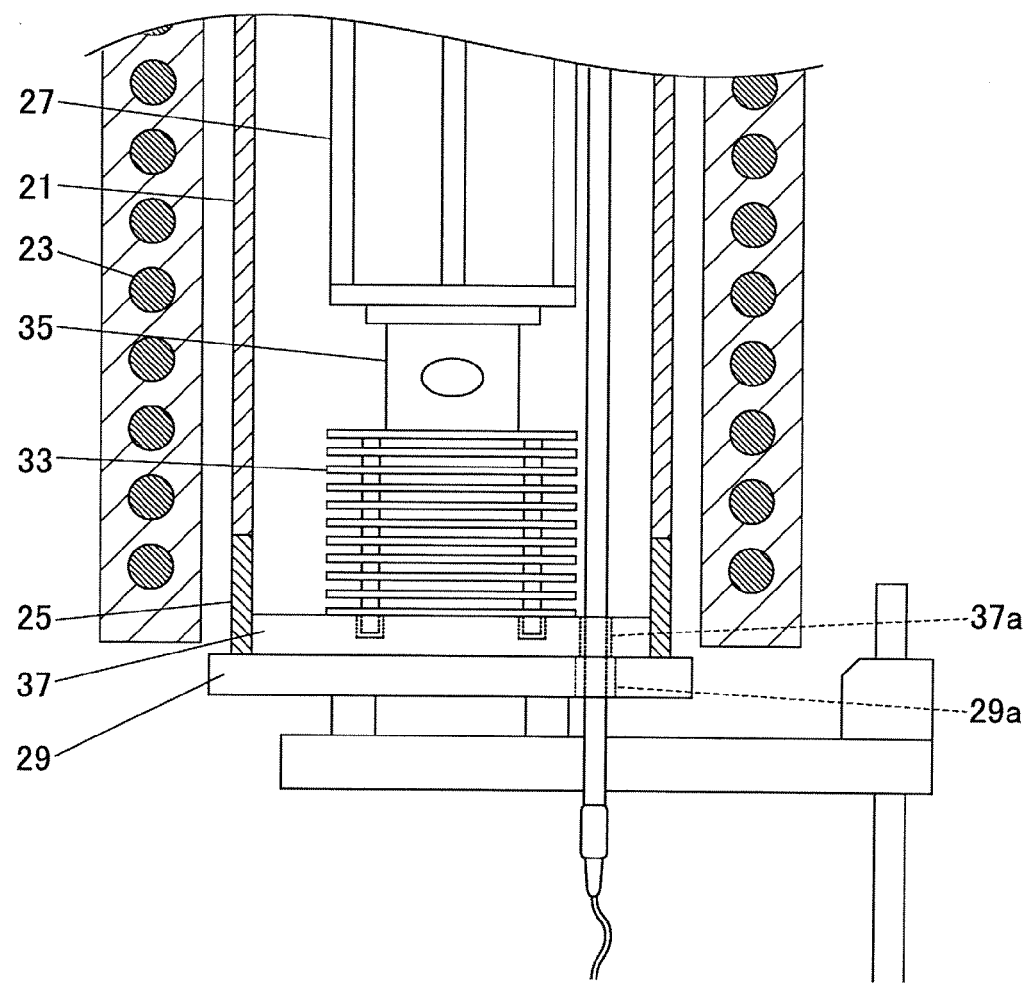
FIG. 10 is a schematic view showing a conventional vertical heat treatment apparatus when a temperature sensor is disposed in the vertical heat treatment apparatus.

For example, when a temperature profile is measured after the reaction tube 1 is exchanged, and when a temperature in the reaction tube 1 is to be measured, the protruding section 13a of the cap section base 13b is rotated from the position where the protruding section 13a closes the through holes of the temperature sensor insertion sections 9a and 11a to a position where the through holes of the temperature sensor insertion sections 9a and 11a are open (see FIGS. 6B and 8). After the through holes of the temperature sensor insertion sections 9a and 11a are open, a temperature sensor 19 using, for example, a thermocouple is inserted in the reaction tube 1 through the through holes of the temperature sensor insertion sections 9a and 11a.

When the cap section base 13b is rotated, the fin section 13c is also rotated. However, as described above, the supporting legs 15a of the fin heat retaining tube 15 standing on the cap section 13 pass through the elongated holes 13d of the cap section base 13b and rest on the base quartz section 11. Because of this structure, not only the fin heat retaining tube 15 but also the SIC heat retaining tube 17 and the SIC boat 7 disposed on the fin heat retaining tube 15 are not rotated when the cap section base 13b is rotated. Because of this feature, it is possible to open and close the through holes of the temperature sensor insertion sections 9a and 11a without changing the positions of the fin heat retaining tube 15, the SIC heat retaining tube 17, and the SIC boat 7 with respect to the base quartz section 11.

As described above, in the vertical heat treatment apparatus according to an embodiment of the present invention, the temperature sensor 19 can be inserted in the reaction tube 1 without disassembling the apparatus, unlike a conventional vertical heat treatment apparatus.

Further, in a conventional vertical heat treatment apparatus, when the base quartz section is exchanged, an operator's hands need to touch the base quartz section. Because of this feature, a baking operation needs to be performed to eliminate pollutants such as "Na" after the exchanging operation. It typically takes about eight hours for the baking operation, during which no productive process can be carried out. However, advantageously, in the vertical heat treatment apparatus according to an embodiment of the present invention, it is not necessary to carry out the exchanging operation of the base quartz section to insert a temperature sensor. Further accordingly, it is not necessary to carry out the baking operation which is conventionally necessary after the exchanging operation of the base quartz sections. Therefore, it is possible to prevent the reduction of the operations rate.

Further, in the vertical heat treatment apparatus according to an embodiment of the present invention, it is not necessary to exchange the base quartz section. Accordingly, it is not necessary to disassemble and reassemble the element parts stacked on the base quartz section. As a result, it is not necessary to adjust the position errors that occur due to the conventional disassembling and reassembling operations. In the prior art, it takes at least three hours to exchange the base quartz section and disassemble and reassemble the element parts. Therefore, it becomes possible to largely cut the time and labor when a vertical heat treatment apparatus according to an embodiment of the present invention is used.

It should be noted that the materials, shapes, configuration, and the like described above are merely examples for illustrative purposes only. Therefore, the present invention is not limited to the embodiment described above. Any modifications and variations can be made without departing from the scope described in claims of the present invention.

What is claimed is:

1. A vertical heat treatment apparatus comprising:
    a reaction tube;
    a heating section surrounding the reaction tube;
    a wafer holding section configured to hold wafers in the reaction tube, the wafer holding section having a fin heat retaining tube having fins made of quartz;
    a supporting section movably provided in the vertical direction so that the wafer holding section can be transferred to and from the inside of the reaction tube and configured to seal the reaction tube while the wafer holding section is in the reaction tube, wherein the supporting section includes a supporting section base and a base quartz section made of quartz on the supporting section base;
    a temperature sensor insertion section provided in the supporting section and having a through hole for guiding a temperature sensor in the reaction tube while the reaction tube is sealed by the supporting section, the temperature sensor insertion section being at the position where the temperature sensor can be inserted in the reaction tube while the wafer holding section is on the supporting section; and
    a cap section configured to open the through hole of the temperature sensor insertion section for insertion of the temperature sensor in the reaction tube and configured to close the through hole of the temperature sensor insertion section to prevent gas leakage from inside the reaction tube to outside the vertical heat treatment apparatus while the wafer holding section is on the cap section, wherein the cap section is further configured to rotate in a plane that is between the base quartz section and the fin heat retaining tube inside the reaction tube and in contact with a top surface of the base quartz section;
    wherein the wafer holding section is placed on the base quartz section in a manner so that the fin heat retaining tube is between the wafer holding section and the base quartz section; and the through hole of the temperature sensor insertion section is configured to be opened and closed by rotating the cap section, and
    wherein the fin heat retaining tube includes plural supporting legs and is configured to stand on the base quartz section with the supporting legs; plural concave portions are formed on the top surface of the base quartz section and configured to determine the positions of the supporting legs of the fin heat retaining tube; the cap section has arc-shaped elongated holes located at positions corresponding to the positions of the supporting legs of the fin heat retaining tube; and wherein the supporting legs of the fin heat retaining tube extend through the elongated holes of the cap section; and wherein the cap section is configured to rotate without changing the positions of the fin heat retaining tube, the supporting legs, and the wafer holding section with respect to the base quartz section.

2. The vertical heat treatment apparatus according to claim 1, wherein the cap section includes a cap section base and fins, and wherein the fins of the cap section are integrally rotatable with the cap section base, and the fins of the cap section are rotatable, such that rotation of the cap section base causes rotation of the fins of the cap section.

3. The vertical heat treatment apparatus according to claim 1, wherein the cap section includes fins.

* * * * *